United States Patent [19]

Dennis

[11] Patent Number: 4,698,132
[45] Date of Patent: Oct. 6, 1987

[54] METHOD OF FORMING TAPERED CONTACT OPENINGS

[75] Inventor: Timothy A. Dennis, Bloomdale, Ohio
[73] Assignee: RCA Corporation, Princeton, N.J.
[21] Appl. No.: 913,325
[22] Filed: Sep. 30, 1986
[51] Int. Cl.$^4$ .......................................... H01L 21/312
[52] U.S. Cl. ................. 156/657; 156/659.1; 156/644; 430/317
[58] Field of Search .............. 156/644, 659.1, 657, 156/653; 430/313, 317

[56] References Cited

U.S. PATENT DOCUMENTS

| | | | |
|---|---|---|---|
| 3,839,111 | 10/1974 | Ham et al. | 156/659.1 |
| 3,867,218 | 2/1975 | Henry | 156/659.1 X |
| 4,507,078 | 3/1985 | Tam | 198/627 X |
| 4,540,462 | 9/1985 | Mizunoya | 156/659.1 X |
| 4,624,749 | 11/1986 | Black | 204/15 |

OTHER PUBLICATIONS

Parisi et al; J. Electrochem. Soc: Solid-State Science & Technology, vol. 124, No. 6, pp. 917–921, Jun. 1977; Tapered Windows in SiO$_2$.
White; J. Electrochem. Soc: Solid-State Science & Technology, vol. 127, No. 12, pp. 2687–2693, Dec. 1980; Bilayer Taper Etching.

Primary Examiner—Kenneth M. Schor
Attorney, Agent, or Firm—S. C. Corwin; B. E. Morris

[57] ABSTRACT

Tapered openings are formed in silicon oxide layers on a substrate by first saturating the silicon oxide layers with water, such as by immersing the substrates and the silicon oxide layers in water. The silicon oxide layers are then heated to dehydrate them to a desired water content at which a desired adhesion of a resist layer to the silicon oxide layer is achieved. A photoresist layer is then coated on the silicon oxide layers and photolithographically defined to provide them with openings therethrough over the area of the silicon oxide layers where the tapered openings are to be provided. The exposed area of the silicon oxide layers are then etched with an etchant for silicon oxide, such as buffered hydrofluoric acid, containing a component for lifting the edge of the resist from the silicon oxide, such as an acid, to etch tapered openings through the silicon oxide layers. Saturating the silicon oxide layers with water and then dehydrating them ensures that the openings have walls of uniform taper etched therethrough.

10 Claims, 6 Drawing Figures

METHOD OF FORMING TAPERED CONTACT OPENINGS

The present invention relates to a method of making tapered openings in a layer of silicon oxide on a substrate, and more particularly, to such a method which will produce uniformly tapered openings.

BACKGROUND OF THE INVENTION

In making semiconductor devices, particularly integrated circuits, the semiconductor substrate is coated with a layer of silicon oxide and openings are provided through the silicon oxide layer through which extends a conductive layer to make contact with the substrate. If the edge of the opening is sharp, breaks or thin sections can be formed in the conductive layer where it passes over the sharp edge. Such breaks or thin sections are undesirable in that they provide electrical openings or areas of increased resistance in the conductive layer. Therefore, it is desirable to taper the sides of the openings to eliminate the sharp edges. One technique which has been found suitable for forming tapered openings is described in U.S. Pat. No. 3,839,111 to E. J. Ham et al., issued Oct. 1, 1974, entitled "Method of Etching Silicon Oxide To Produce A Tapered Edge Thereon". In the process described in U.S. Pat. No. 3,839,111, the silicon oxide layer is coated with a layer of a resist which is provided with an opening therethrough. As the exposed portion of the silicon oxide is etched away, the etchant causes the resist layer to lift up from the surface of the silicon oxide at the edge of the opening resulting in a tapered wall of the opening.

A problem which has been found in using this process on a production basis is that the angle of the taper varies with the season of the year. I have found that this seasonal variation is a result of variations in humidity which causes variations in the water content of the silicon oxide layer. The water content of the silicon oxide layer affects the adhesion of the resist layer to the silicon oxide. This, in turn, affects the lift off capability of the resist layer which affects the taper of the opening etched in the silicon oxide layer. For mass production of semiconductor devices it is desirable to have a process which produces openings in the silicon oxide which are of uniform taper.

SUMMARY OF THE INVENTION

Tapered openings are etched in a layer of silicon oxide on the surface of a substrate by first saturating the silicon oxide layer with water. The silicon oxide layer is then heated to dehydrate it to a desired amount. A resist layer is then coated on the silicon oxide layer and provided with an opening therethrough to expose a portion of the silicon oxide layer. The silicon oxide layer is then etched so as to cause the edge of the resist layer to lift up to cause a tapered opening to be etched through the silicon oxide layer.

DETAILED DESCRIPTION OF PREFERRED EMBODIMENT

Figure 2:
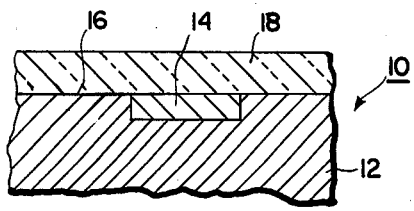
FIGS. 2-6 are sectional views of a portion of a semiconductor device illustrating the various steps of the method of the present invention.

Referring initially to FIG. 2 of the drawing, a semiconductor device, such as an integrated circuit, is generally designated as 10. The integrated circuit 10 includes a substrate 12 of a semiconductor material, such as single crystalline silicon, having a doped region 14 therein along a major surface 16 thereof. For example, the substrate 12 may be of one conductivity type, such as P type, and the doped region 14 may be of the opposite conductivity type, such as N type.

Figure 1:
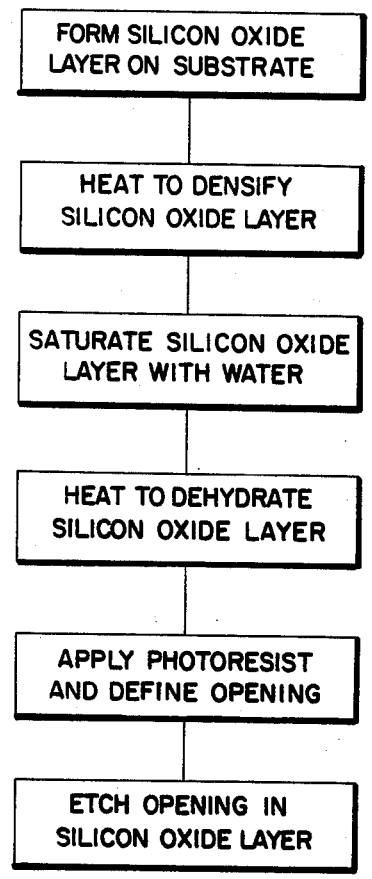
FIG. 1 is a flow chart of the method of the present invention.

As indicated in FIG. 1 and shown in FIG. 2, a layer 18 of an insulating material, such as silicon oxide, is formed on the substrate surface 16. This may be achieved by first thermally growing a thin layer, about 500 angstroms of silicon oxide on the substrate surface 16 at about 800° C. to provide a clean silicon oxide layer at the substrate surface 16. Then the remaining thickness of the silicon oxide layer 18 may be formed by deposition from a gas containing silicon, such as silane, at a temperature of about 370° C. The thickness of the silicon oxide layer 18 is not critical but may be on the order of about 10,000 angstroms. As indicated in FIG. 1, the silicon oxide layer 18 is then heated to densify it. This may be carried out by heating the silicon oxide layer at a temperature of about 1000° C. for about 20 minutes.

The silicon oxide layer is then saturated with water. This may be achieved by immersing the substrate 12 with the silicon oxide layer 18 thereon in water for about 5 minutes. This may also be achieved by placing the substrate 12 and silicon oxide layer 18 in a chamber containing water vapor at a very high humidity. Although it is not absolutely essential that the silicon oxide layer 18 be completely saturated with water, it is preferred to do so since, for reasons which will be explained, this ensures placing the silicon oxide layers 18 of all of the substrates 12 at the same level of water content. The substrate 12 with the silicon oxide layer 18 thereon is then heated to dehydrate the silicon oxide layer 18 to a desired water content. The amount of dehydration is not critical as long as the silicon oxide layers 18 on all of the substrates 12 are dehydrated to the same amount. Also, the temperature and time of heating is not critical since, the higher the temperature, the shorter the time needed to heat the silicon oxide layer to achieve the desired amount of dehydration. Preferably, the silicon oxide layer 18 is heated at about 200° C. for about one-half hour.

Figure 3:
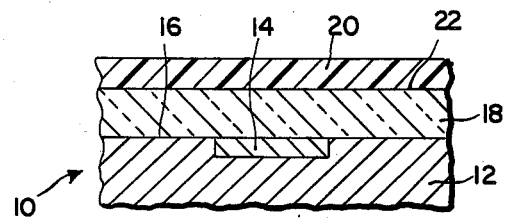
Figure 4:
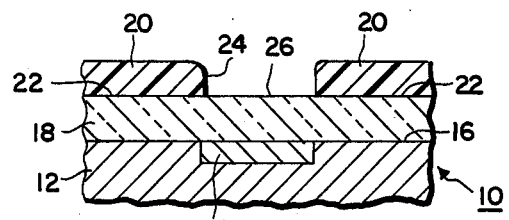

As shown in FIG. 3, a layer 20 of a photoresist is applied to the surface 22 of the silicon oxide layer 18. The photoresist layer 20 is preferably a negative photoresist, such as KTFR (Kodak Thin-Film Resist), and is applied in a manner well known in the semiconductor processing art, such as by spin coating. The photoresist layer 20 is then defined, using standard photolithographic techniques, to form an opening 24 therethrough which exposes the surface area 26 of the silicon oxide layer 18 where the tapered opening is to be formed. The photoresist layer 20 is then prebaked at a temperature of about 52° C.±2° for a period of about 20 minutes prior to etching the silicon oxide layer 18.

As described in U.S. Pat. No. 3,839,111, the silicon oxide layer 18 is then etched with a composite solution that comprises both an etchant for the silicon oxide layer 18 and a resist-lifting component for lifting the edge of the photoresist layer 20 from the surface of the silicon oxide layer 18. The etchant for the silicon oxide layer can be a conventional buffered HF etching solution, which is a mixture of hydrofluoric acid and ammonium fluoride, and the resist-lifting component for lifting the edge of the photoresist layer 20 is an acid, such as nitric acid, phosphoric acid, or acetic acid, for example. The amount of resist-lifting component in the composite solution will be dependent on the temperature chosen for the etching. A typical suitable etchant is a mixture of by volume 4 parts of concentrated HF, 25 parts ammonium fluoride (48% solution) and 11 parts acetic acid. However, the etchant may include as much as 15 parts acetic acid and will achieve the same results.

Figure 5:
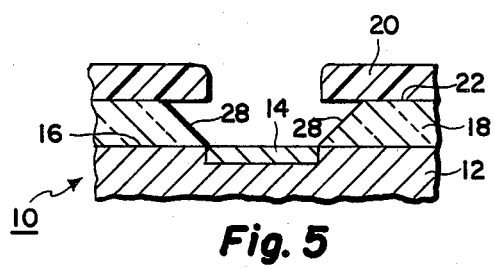

The silicon oxide layer 18 is subjected to the etching solution for a time sufficient to etch completely through the silicon oxide layer and expose a portion of the surface 16 of the substrate 12. As shown in FIG. 5, this forms an opening in the silicon oxide layer having a tapered wall 28. The amount of taper (angle formed with the horizontal) of the delineated edges of the silicon oxide layer 18 is determined by the temperature at which the etching is done, the time duration of etching, and the adhesion of the photoresist layer 20 to the silicon oxide layer 18 (which is partially a function of the water content of the silicon oxide layer 18). Suitable tapered edges are of an angle between 25° and 45°.

EXAMPLE

A group of silicon substrates 12 having a layer of silicon oxide 18 thereon of a thickness of 13,000 angstroms and densified at a temperature of about 1000° C. for about 20 minutes were immersed in water for about 5 minutes to saturate the silicon oxide layer 18 with water. The substrates were then heated at 190° C. ±10° for about one-half hour to dehydrate the silicon oxide layers 18. The silicon oxide layers were then coated with a negative photoresist, Hunt's Waycoat HNR999, and photolithographically defined to form an opening therethrough. The photoresist layers were then prebaked at about 52° C. for 20 minutes and the exposed silicon oxide was then subjected to the etchant described above at a temperature of 26° C. ±1° for about 8.5 minutes. This provided openings through the silicon oxide layer having a tapered wall of 25°–45°.

Figure 6:
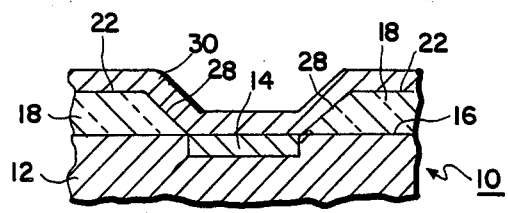

Once the opening is etched through the silicon oxide layer 18, the photoresist layer 20 is stripped from the silicon oxide layer 18 using a suitable solvent. As shown in FIG. 6, a layer 30 of a conductive material, such as a metal or doped polycrystalline silicon, can then be deposited onto the surface of the silicon oxide layer 18, into the opening in the silicon oxide layer along the tapered surface 28 and on the exposed surface of the substrate 12. The absence of steep steps and/or recess portions at the edge of the opening in the silicon oxide layer eliminates the possibilities of regions of high resistivity and/or discontinuites in the conductive layer 30 which would otherwise occur in the absence of the tapered wall 28.

In the method of the present invention, by saturating the silicon oxide layer with water, the silicon oxide layers of all the substrates being made are first brought to a common level of water content. By saturating the silicon oxide layers with the water, it is easier to achieve the same water content for all of the substrates being treated. The substrates 12 and the silicon oxide layers 18, which are saturated with water, are then heated to dehydrate the silicon oxide layers to the same level of water content. The silicon oxide layers are dehydrated to improve the adhesion of the photoresist layer 20 to the silicon oxide layer 18. Since all of the silicon oxide layers 18 on all of the substrates 12 start from the same level of water content, they will reach the same level of dehydration when heated at a common temperature for a common period of time. This also allows for control of the water content of the dehydrated silicon oxide layers by controlling the temperature and time of dehydration. Thus, there can be easily achieved uniform adhesion of the photoresist layer 20 to the silicon oxide layers 18 of all of the substrates 12 being operated on at any one time. Thus, there is provided by the present invention a method of achieving uniform adhesion of the photoresist layer 20 to the silicon oxide layer 18 so as to achieve a uniform taper of the openings being formed in the silicon oxide layer. This uniformity is achieved even if the humidity of the ambient varies with the time of the year or other ambient conditions.

I claim:

1. In a method of etching tapered openings in a layer of silicon oxide or a substrate wherein a layer of a resist is coated on the silicon oxide layer, the resist layer is provided with an opening therethrough to expose a portion of the silicon oxide layer and the silicon oxide layer is etched such that the edge of the resist layer is lifted from the silicon oxide layer to cause a tapered opening to be etched through the silicon oxide layer, the improvement comprising the step of prior to coating the silicon oxide layer with the resist, substantially saturating the silicon oxide layer with water, and then heating the silicon oxide layer to dehydrate the silicon oxide layer a desired amount such that all of the silicon oxide layer is dehydrated to substantially the same moisture level.

2. A method in accordance with claim 1 in which the silicon oxide layer is saturated with water by immersing the silicon oxide in water for a period long enough to ensure saturation.

3. A method in accordance with claim 2 in which the silicon oxide layer saturated with water is heated to dehydrate the layer to an amount which provides a desired adhesion of the resist layer on the silicon oxide layer.

4. A method in accordance with claim 3 in which the silicon oxide layer is dehydrated by heating at about 200° C. for about 30 minutes.

5. A method in accordance with claim 4 in which the resist is a negative photoresist.

6. A method in accordance with claim 2 in which the silicon oxide layer is etched with an etchant containing a component for etching the silicon oxide and a component for lifting the resist.

7. A method in accordance with claim 6 in which the component of the etchant for etching the silicon oxide is a mixture of hydrofluoric acid and ammonium fluoride and the component for lifting the resist is an acid.

8. A method in accordance with claim 7 in which the component of the etchant for lifting the resist is an acid selected from the group consisting of nitric acid, phosphoric acid and acetic acid.

9. A method in accordance with claim 6 in which the etchant is a mixture of by volume 4 parts concentrated hydrofluoric acid, 25 parts ammonium fluoride (48% concentration) and 11 parts acetic acid.

10. A method in accordance with claim 9 in which the resist is a negative photoresist.

* * * * *

UNITED STATES PATENT AND TRADEMARK OFFICE
CERTIFICATE OF CORRECTION

PATENT NO. : 4,698,132

DATED : Oct. 6, 1987

INVENTOR(S) : Timothy A. Dennis

It is certified that error appears in the above-identified patent and that said Letters Patent is hereby corrected as shown below:

Column 4    Line 21    "or" should be --on--

Signed and Sealed this

Twenty-sixth Day of July, 1988

*Attest:*

DONALD J. QUIGG

*Attesting Officer*      *Commissioner of Patents and Trademarks*